United States Patent [19]

Champlin

[11] Patent Number: 4,825,170

[45] Date of Patent: Apr. 25, 1989

[54] ELECTRONIC BATTERY TESTING DEVICE WITH AUTOMATIC VOLTAGE SCALING

[76] Inventor: Keith S. Champlin, 5437 Elliot Ave. S., Minneapolis, Minn. 55417

[21] Appl. No.: 198,484

[22] Filed: May 25, 1988

[51] Int. Cl.$^4$ .......................................... G01N 27/46
[52] U.S. Cl. ................................... 324/436; 324/426; 324/430; 340/636
[58] Field of Search ............... 324/426, 430, 436, 433; 320/48; 340/636

[56] References Cited

U.S. PATENT DOCUMENTS

| | | | |
|---|---|---|---|
| 3,593,099 | 7/1971 | Scholl | 340/636 |
| 3,909,708 | 9/1975 | Champlin | 324/431 |
| 4,126,874 | 11/1978 | Suzuki et al. | 340/636 |
| 4,719,428 | 1/1988 | Liebermann | 324/436 |

Primary Examiner—Reinhard J. Eisenzopf
Assistant Examiner—Anthony L. Miele
Attorney, Agent, or Firm—Dorsey & Whitney

[57] ABSTRACT

A self-contained electronic device for testing disparate storage batteries having any one of a fixed plurality of possible nominal voltages is disclosed. The testing device performs small-signal measurements of a battery's dynamic conductance and provides either a proportional numerical readout, displayed in appropriate battery measuring units, or a corresponding qualitative assessment of the battery's relative condition. Special voltage-sensing circuitry within the testing device identifies the particular one of the possible nominal voltages possessed by the battery and scales the dynamic conductance measurements accordingly. As a result, the quantitative or qualitative information provided to the user is automatically adjusted to comport with the nominal voltage of the battery undergoing test without the user having to actually input the battery's nominal voltage to the testing device.

19 Claims, 4 Drawing Sheets

ELECTRONIC BATTERY TESTING DEVICE WITH AUTOMATIC VOLTAGE SCALING

TECHNICAL FIELD

This invention relates to an electronic measuring device for assessing the ability of a storage battery or other dc source of electricity to deliver power to a load. More specifically, it relates to improved measuring apparatus of the type disclosed in U.S. patent application Ser. No. 169,858, filed by Keith S. Champlin on Mar. 18, 1988, and to U.S. Pat. No. 3,873,911 and 3,909,708, issued to Keith S. Champlin on Mar. 25, 1975, and on Sept. 30, 1975, respectively.

BACKGROUND ART

Storage batteries are employed in many applications requiring electrical energy to be retained for later use. Most commonly, they are employed in motor vehicles utilizing internal combustion engines. In such applications, energy is stored by "charging" the battery during engine operation and is later used to power lights, radio, and other electrical apparatus when the engine is stopped. The most severe demand upon the battery of a motor vehicle is generally made by the starter motor. Failure to supply the stator motor with sufficient power to satisfactorily crank the engine, particularly in cold weather, is usually the first induction of battery deterioration or trouble with the charging system. Clearly, a simple measurement that accurately assesses a battery's ability to supply power to a heavy load is of considerable value.

Prior to the publication of U.S. Pat. Nos. 3,873,911 and 3,909,708, the only method generally available for accessing a battery's ability to supply load power was the standard load test. A standard load test subjects a battery to a heavy dc load current having a predetermined value dictated by the battery's rating. After a prescribed time interval, the battery's terminal voltage under load is observed. The battery is then considered to have "passed" or "failed" the load test according to whether its terminal voltage is greater than, or less than, a particular value.

Although the standard load test has been widely used for many years to field-test storage batteries, it possesses several serious disadvantages. These disadvantages include:

1. A standard load test draws very large currents and therefore requires apparatus that is heavy and cumbersome.
2. Because of these large currents, considerable "sparking" will occur at the battery terminals if the test apparatus is connected or disconnected under load conditions. Such "sparking" in the presence of battery gasses can cause an explosion with potentially serious injury to the operator.
3. A standard load test leaves the battery in a significantly reduced state of charge and therefore less capable of cranking the engine than before the test was performed.
4. The battery's terminal voltage drops with time during performance of a load test. Accordingly, load tests results are generally imprecise and greatly dependent upon the skill of the operator.
5. Load test results are not repeatable since the test itself temporarily polarizes the battery. Such test-induced polarization significantly alters the initial conditions of any other load tests performed subsequently.

A practical alternative to the standard load test is taught in U.S. Pat. No. 3,873,911, U.S. Pat. No. 3,909,708, and U.S. patent application Ser. No. 169,858. These documents disclose electronic apparatus for accurately assessing a battery's condition by means of small-signal ac measurements of its dynamic conductance. They teach that a battery's dynamic conductance is directly proportional to its load test current; or to its dynamic power—the maximum power that the battery can deliver to a load. Dynamic conductance is therefore a direct measure of a battery's electrical condition.

Two electronic battery tester embodiments are disclosed in U.S. Pat. No. 3,873,911; each of which accurately determines a battery's dynamic conductance and provides the operator with a numerical reading in battery meeasuring units that are directly proportional to this quantity. The first embodiment comprises a bridge circuit that is brought to balance by the operator to obtain the numerical reading. The preferred second embodiment provides the operator with a direct readout that may be displayed numerically on a digital or analog meter. The operating principles of the preferred, direct-reading, second embodiment of the invention taught in U.S. Pat. No. 3,873,911 are based upon the theory of high-gain feedback amplifiers.

U.S. Pat. No. 3,909,708 likewise discloses two electronic battery tester embodiments. However, from the operator's point of view, their operation more closely resembles the operation of a traditional load-test apparatus than does operation of either of the numerical-reading embodiments disclosed in U.S. Pat. No. 3,873,911. Rather than obtaining a numerical measurement, the operator manually sets a selector knob on the panel of the apparatus to the electrical rating of the battery undergoing test. The disclosed apparatus then employs small-signal measurements of dynamic conductance to simply ascertain whether or not the battery is capable of delivering an amount of power appropriate to the selected rating. Accordingly, the two embodiments disclosed in U.S. Pat. No. 3,909,708 provide qualitative "pass-fail" battery condition information, just as does a conventional load test apparatus. However, they accomplish this result without drawing significant current from the battery and are therefore not subject to the serious disadvantages of a load test. Just as with the second embodiment disclosed in the earlier patent, the operating principles of the second, preferred, embodiment disclosed in U.S. Pat. No. 3,909,708 are based upon the theory of high-gain feedback amplifiers.

The improved electronic battery testing device disclosed in U.S. patent application Ser. No. 169,858 incorporates the functions of both of the two earlier-disclosed feedback-type electronic battery testing devices in a single embodiment. By using all fixed resistances and calibrating the output display in appropriate battery measuring units, the disclosed device emulates a direct reading battery tester. In addition, by letting one resistance be variable, calibrating it in appropriate battery rating units, and arranging the output display to denote qualitative conditions, the "pass-fail" type of dynamic conductance battery tester is emulated. A two-position switch is employed to select either a fixed resistance or a variable resistance and hence to select the emulation of either the direct-reading battery testing device or the "pass-fail" type of battery testing device.

In comparison with the load test method of battery appraisal, the dynamic conductance testing method has many advantages. For example, dynamic conductance testing utilizes electronic apparatus that is small and lightweight, draws very little current, produces virtually no sparking when connected or disconnected, does not significantly discharge or polarize the battery, and yields very accurate, highly reproducible, test results. Virtually millions of battery measurements performed over the course of thirteen years have fully corroborated these teachings and have proven the validity of this alternative testing method.

SUMMARY OF THE INVENTION

A battery's dynamic conductance is known to be proportional to its electrical condition described in several traditional battery measuring units such as load-test current, ampere-hours, or watts. However, the proportionality constant relating dynamic conductance to the appropriate traditional measuring units depends upon the number of series-connected cells comprising the battery and therefore upon the battery's nominal terminal voltage. As a consequence, the nominal voltage of the battery must be taken into account to properly interpret the dynamic conductance of a specific battery in terms of any of the traditional battery measuring units.

Heretofore, the necessity for taking the nominal battery voltage into account in interpreting dynamic conductance test results has been addressed in one of two ways. Either the testing device has been restricted to testing only batteries having a common nominal voltage; or else the user has been required to input the battery's nominal voltage to the testing device with a selector switch. Neither of these approaches is totally satisfactory. The first approach would require two completely different battery testing devices to test both six-volt and twelve-volt batteries. The second approach would introduce serious errors if the user inadvertently selected the wrong nominal battery voltage; or neglected to change the voltage selection when changing from testing, say, twelve-volt batteries to testing six-volt batteries.

The invention described herein below solves the problem of introducing the nominal battery voltage in a different way. A self-contained electronic device for testing disparate batteries having any one of a fixed plurality of possible nominal terminal voltages is disclosed. The testing device performs small-signal measurements of a battery's dynamic conductance and provides either a proportional numerical readout, displayed in appropriate battery measuring units, or a corresponding qualitative assessment of the battery's relative condition. Special voltage-sensing circuitry within the testing device identifies the particular one of the possible nominal voltages possessed by the battery and scales the dynamic conductance measurements accordingly. As a result, the quantitative or qualitative information provided to the user is automatically adjusted to comport with the nominal voltage of the battery undergoing test without the user having to actually input the battery's nominal voltage to the testing device.

The electronic battery testing device with automatic voltage scaling hereof can be used to obtain a qualitative or quantitative assessment of a wide variety of composite dc energy sources. In addition to lead-acid storage batteries, the invention can be used to test many other series connected energy sources such as nickel-cadmium batteries; lithium batteries; solar batteries; fuel cell batteries; thermo-electric cell batteries; and magneto hydrodynamic cell batteries. The invention hereof is widely applicable to such testing applications by virtue of its simplicity, its safety, its accuracy, its ease of operation, and its low cost.

BRIEF DESCRIPTION OF THE DRAWINGS

FIG. 1a depicts a load test performed upon a single cell. FIG. 1b depicts a load test performed upon a battery comprised of n single cells connected in series.

DETAILED DESCRIPTION

Figure 1A:
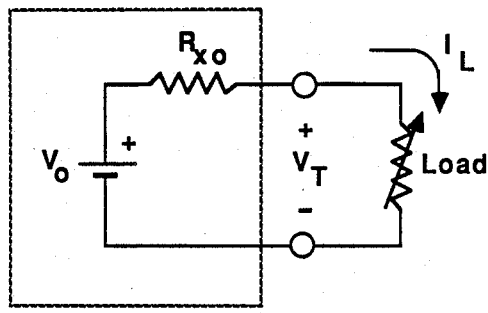
FIGS. 1a and 1b are simplified schematic diagrams illustrating voltage-current conditions that prevail during performance of a conventional load test.

One of the traditional quantities used for measuring and rating batteries is "load-test current" expressed in amperes. Referring first to FIG. 1a, a simplified schematic diagram depicting a single cell undergoing a load test is shown. The cell is represented by its Thevenin's equivalent circuit comprising the cell's internal voltage. $V_o$, in series with its internal resistance, $R_{xo}$. The load-test current is represented as $I_L$ in FIG. 1a and the cell's terminal voltage at the conclusion of the load test is represented as $V_T$.

Applying Ohm's law of the circuit of FIG. 1a yields $$I_L = \frac{(V_o - V_T)}{R_{xo}} = (V_o - V_T)G_{xo} \qquad (1)$$

where $G_{xo} = 1/R_{xo}$ is the cell's dynamic conductance.

Equation (1) shows that the constant of proportionality relating the cell's dynamic conductance to its load-test current is $(V_o - V_T)$. The exact value of this proportionality constant depends upon $V_T$ and therefore upon the precise definition of the particular load test under consideration. An infinite variety of load test definitions are possible. However, two particular definitions are common. One is the "standard load test", which is often used in field-testing shortage batteries. With the "standard test load", $V_T$ equals 1.6 volts after a 15 second discharge at room temperature. The other common load test is the "cold-cranking test"; defined in SAE Standards J537 and used in providing factory ratings of batteries employed in starting applications. With the "cold-cranking test", $V_T$ equals 1.2 volts after a 30 second discharge at zero degrees Fahrenheit.

Figure 1B:
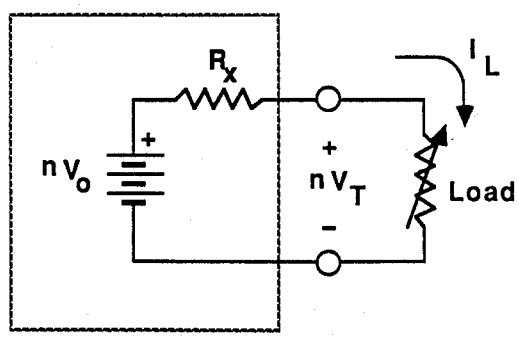

Referring next to FIG. 1b, a simplified schematic diagram is shown which depicts a battery comprised of n series-connected single cells undergoing a load test. Both the internal voltage, $V_o$, and the terminal voltage, $V_T$, of a single cell are multiplied by the number of cells, n, in the battery of FIG. 1b. The load-test current of the battery is therefore written $$I_L = \frac{n(V_o - V_T)}{R_x} = n(V_o - V_T)G_x \quad (2)$$

where $G_x = 1/R_x$ is the dynamic conductance of the battery.

Assuming that the single-cell quantities, $V_o$ and $V_T$, are the same for the load-tested battery depicted in FIG. 1b as for the load-tested single-cell of FIG. 1a, the constant of the proportionality relating dynamic conductance to load-test current for the battery is seen to be simply that for the single cell multiplied by the number of cells, n. Accordingly, dynamic conductance measurements can be related to load-test current in amperes by multiplying $G_x$ by an appropriate single-cell constant and then scaling the result in proportion to the number of cells.

A second traditional quantity used for measuring and rating batteries is "ampere-hours" defined in a low-rate discharge test for a specific time to a particular terminal voltage. Although this quantity is not as directly related to $G_x$ as is load-test current, extensive measurements have shown that the relationship is still a linear one for large classes of batteries that are constructed in a similar fashion. In addition, the constant of proportionality which relates $G_x$ to ampere-hours, as in the case of load-test current, is directly proportional to the number of cells, n. Accordingly, dynamic conductance measurements can be likewise related to ampere-hours by multiplying $G_x$ by an appropriate single-cell constant and then scaling the result in proportion to the number of cells.

A third traditional quantity used for measuring and rating batteries is "available power" or "dynamic power" expressed in watts. This quantity is defined in terms of a particular load test in which the load resistance is adjusted to be exactly equal to the internal battery resistance $R_x$. Under these very special "matched load" conditions, exactly one-half of the battery's internal voltage is dropped across $R_x$, and one-half is dropped across the load.

Referring again to FIG. 1b, the load current under "matched load" conditions is seen to be $$I_L = \frac{n(V_o/2)}{R_x} = n(V_o/2)G_x \quad (3)$$

The power delivered to the "matched load" is the "available power" or "dynamic power". Its value, expressed in watts, is given by $$P_A = I_L(nV_o/2) = n^2(V_o/2)^2 G_x \quad (4)$$

One sees from equation (4) that the relationship between dynamic conductance and available power in watts is also a linear one. However, the constant of proportionality relating to two quantities is proportional to the square of the number of cells comprising the battery; not to the number of cells itself, as is the case for both load-test current and ampere-hours. Accordingly, dynamic conductance measurements can be related to available power in watts by multiplying $G_x$ by an appropriate single-cell constant and then scaling the result in proportion to the square of the number of cells.

From the foregoing discussion, it is clear that the number of cells must be properly taken into consideration when relating dynamic conductance, measured by an electronic battery testing device, to traditional battery measuring units such as load-test current in amperes, ampere-hours, or available power in watts. The number of cells connected in series is directly proportional to the battery's nominal terminal voltage. Hence, scaling $G_x$ measurements in proportion to the number of cells, or the square of that number, is equivalent to scaling in proportion to the battery's nominal voltage, or the square of its nominal voltage.

Heretofore, the problem of considering the nominal battery voltage in relating $G_x$ measurements to traditional battery measuring or rating units has been addressed by either building a single proportionality constant permanently into the testing device, and restricting the device to testing only batteries having the one appropriate nominal voltage, or else by requiring the user to select an appropriate proportionality constant by inputting the battery's nominal voltage with a switch. In contrast, the invention hereof takes the nominal voltage of the battery being tested into consideration automatically without any action by the operator.

Figure 2:
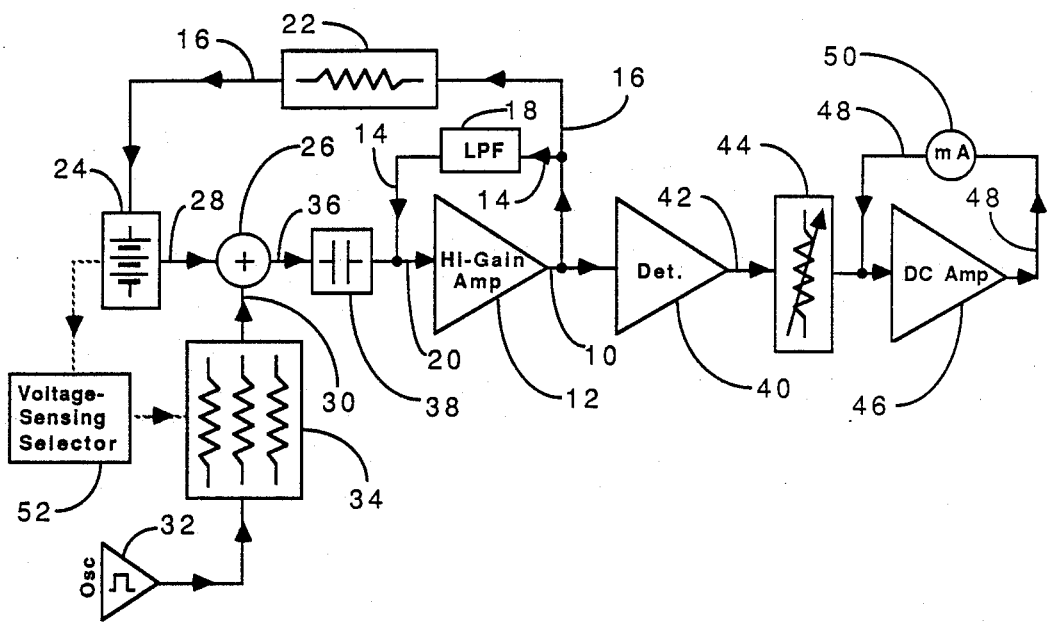
FIG. 2 is a simplified block diagram of an improved electronic battery testing device with automatic voltage scaling in accordance with the present invention.

Referring now to FIG. 2, a simplified block diagram of an improved electronic battery testing device with automatic voltage scaling is depicted. Signals representative of the signal at output 10 of high-gain amplifier cascade 12 are fed back to input 20 of high-gain amplifier cascade 12 by means of two feedback paths; internal feedback path 14 and external feedback path 16. Internal feedback path 14 includes low pass filter (LPF) 18 and feeds a signal directly back to input 20 of high-gain amplifier cascade 12. The purpose of internal feedback path 14 and low pass filter 18 is to provide large dc feedback but very little ac feedback in order to fix the operating point of high-gain amplifier cascade 12 and insure its dc stability without appreciably reducing its ac voltage gain. External feedback path 16 contains resistive network 22 and feeds a signal back to the battery undergoing test 24. Summation circuitry 26 combines the resulting signal voltage 28 developed thereby across battery 24 with a 100 Hz periodic square-wave signal voltage 30 provided by oscillator 32 through selectable attenuator network 34. The resulting composite signal 36 is capacitively coupled to input 20 of high-gain amplifier cascade 12 by means of capacitive coupling network 38.

As has been fully explained in U.S. patent application Ser. No. 169,858, the voltage at output 10 of high-gain amplifier cascade 12 comprises a constant dc bias component along with an ac signal component that is proportional to the dynamic conductance of the battery undergoing test 24. The constant dc bias component is ignored while the ac signal component is detected and accurately converted to a dc signal by detector 40.

The dc signal at output 42 of detector 40 is passed through adjustable resistive network 44 and applied to the input of dc-coupled operational amplifier 46. Feedback path 48 of operational amplifier 46 contains dc milliameter 50. Accordingly, the reading of dc milliameter 50 is proportional to the dc signal level at the output 42 of detector 40, and hence to the dynamic conductance of battery 24; while the constant of proportionality is controlled by the value of resistive network 44.

By utilizing an appropriate fixed resistance value in resistive network 44 and then calibrating milliameter 50 in battery rating units proportional to the battery's dynamic conductance, the embodiment disclosed in FIG.

2 will emulate the direct reading battery tester disclosed in U.S. Pat. No. 3,873,911. In addition, as is fully taught in U.S. patent application Ser. No. 169,858, the resistance value of resistive network 44 which brings the reading of dc milliameter 50 to a particular fixed value is directly proportional to the dynamic conductance of battery 24. Hence, by linearly calibrating resistive network 50 in traditional battery rating units, and then designating "pass" and "fail" regions on the face of milliameter 50, the embodiment disclosed in FIG. 2 will also emulate the "pass-fail" battery testing device disclosed in U.S. Pat. No. 3,909,708. Thus, by employing a switch to select either a fixed-valued resistive network 44 or an adjustable-valued network 44 that is linearly calibrated in battery rating units, and then providing both a linear scale and "pass-fail" regions on the face of milliameter 50, one can realize both a direct-reading battery tester and a "pass-fail" battery tester with a single device.

The level of the dc signal at the output 42 of detector 40 is directly proportional to the level of the square-wave signal 30 at the output of selectable attenuator network 34. Hence, both the level of the numerical quantity displayed in direct-reading operation as well as the qualitative assessment provided in "pass-fail" operation are determined by the value of selectable attenuator 34. In the invention hereof, selectable attenuator 34 is under the control of voltage-sensing selector 52, which senses the terminal voltage of battery 24. By comparing this terminal voltage with one or more fixed reference voltages, voltage-sensing selector 52 identifies the particular nominal voltage of battery 24 from among a fixed plurality of possible nominal voltages. Based upon this identification, voltage-sensing selector 52 automatically selects an appropriate attenuation value in selectable attenuator 34. This effectively scales the level of the signal at output 42 of detector 40 and brings the output information provided to the user in conformance with the identified nominal voltage of the battery undergoing test.

For proportional scaling, as is desired for output information in amperes or ampere-hours, the selected attenuation—defined as the ratio of input to output signal—would be inversely proportional to the identified nominal voltage. For square-law scaling, as desired for output information in watts, the selected attenuation values would be inversely proportional to the square of the identified nominal voltage. It will be apparent to one skilled in the art that any other scaling rule could be similarly implemented.

The embodiment disclosed in FIG. 2 utilizes a dc milliameter to display the results of the test. However, one should be aware of the fact that this particular display implementation represents only one of many possible display implementations. For example, the numerical display required of a direct-reading battery tester could be realized with a digital meter, or with a numeric printout, or with a display on a computer terminal. Similarly, the qualitative display required of a "pass-fail" battery tester could be implemented with a plurality of colored lights or with an audible signal. These, and other choices would be obvious to one skilled in the art and are intended to be included within the scope of the present invention.

Figure 3:
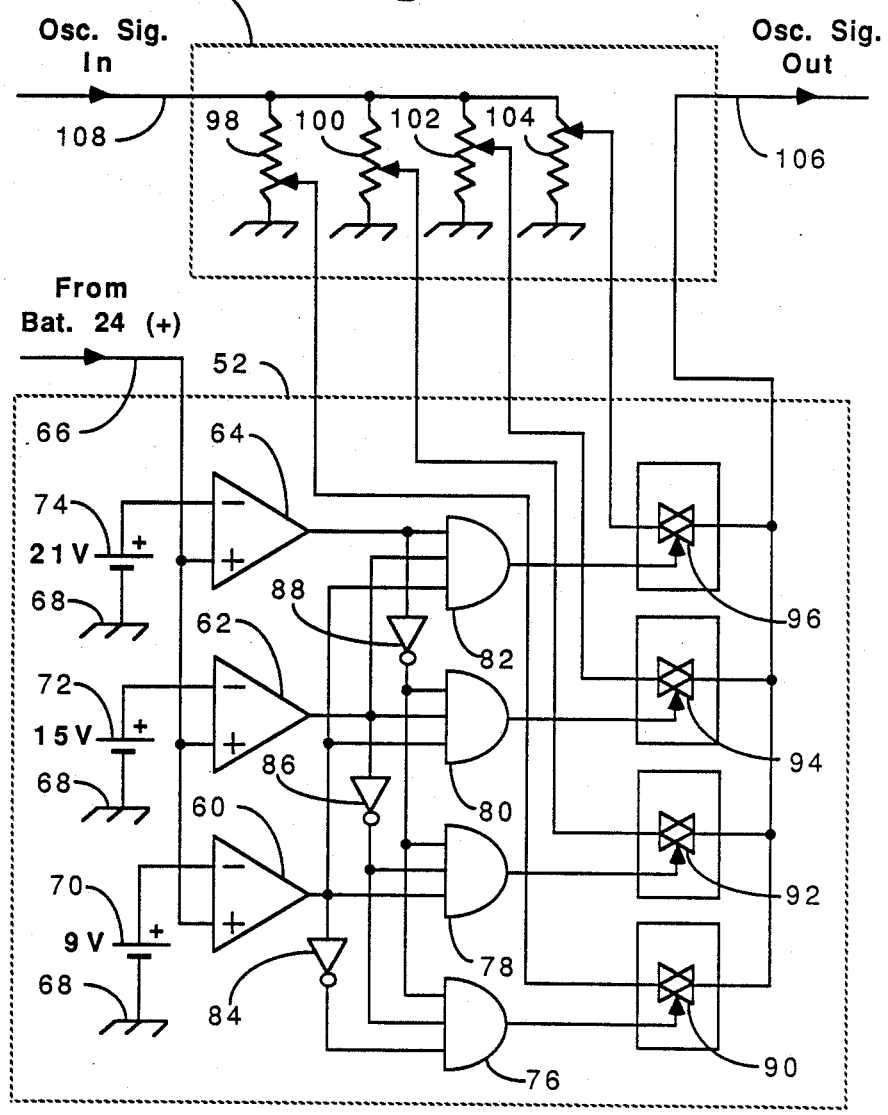
FIG. 3 is a schematic diagram of one possible embodiment of the voltage-sensing selector and selectable attenuator blocks depicted in the block diagram of FIG. 2 for a device configured for testing batteries having nominal voltages of either 6, 12, 18 or 24 volts.

Referring next to FIG. 3, one possible embodiment of the two blocks identified generally as selectable atteuator network 34 and voltage-sensing selector 52 in the block diagram of FIG. 2 is disclosed. The particular embodiment disclosed provides automatic scaling of measurements on disparate lead-acid storage batteries, each comprising either 3, 6, 9, or 12 cells. Since a single lead-acid cell has a nominal voltage of approximately two volts, each respective battery will have a nominal terminal voltage of either 6 volts, 12 volts, 18 volts, or 24 volts. The total number of different nominal voltages considered with reference to FIG. 3, as well as their respective values, is intended for illustrative purposes only. It will be clear to one skilled in the art that other numbers of different battery voltages, and other battery voltage values, could just as well be employed without departing from the scope of the invention disclosed.

The positive terminal of the battery undergoing test 24 connects to the non-inverting inputs of three voltage comparators 60, 62, and 64, through a voltage-sensing conductor 66. The negative terminal of battery 24 connects to common ground 68. Three reference voltage sources having voltages of 9 volts, 15 volts, and 21 volts—70, 72, and 74, respectively—connect between reference ground 68 and the inverting inputs of voltage comparators 60, 62, and 64, respectively.

Outputs of voltage comparators 60, 62, and 64 connect to the inputs of four three-input AND gates 76, 78, 80, and 82. These connections either proceed directly, or through the three inverters 84, 86, and 88. Outputs of AND gates 76, 78, 89, and 82 connect, respectively, to the control terminals of four analog switches 90, 92, 94, and 96. The signal terminals of analog switches 90, 92, 94, and 96, are interposed between the output terminals of the four potentiometers, 98, 100, 102, and 104, respectively, and a common oscillator-signal output conductor 106. Input terminals of potentiometers 98, 100, 102, and 104 all connect to a common oscillator-signal input conductor 108.

The circuit disclosed in FIG. 3 functions as follows: If battery 24 has a terminal voltage that is nominally 6 volts, the non-inverting inputs of all three voltage comparators will have lower potentials than the respective inverting inputs. Accordingly, the outputs of all three voltage comparators will be in logic-low states. Under these circumstances, the three inputs of AND gate 76 will be in logic-high states by virtue of inverters 84, 86, and 88 interposed between the outputs of comparators 60, 62, and 64, and the inputs of AND gate 76. The other three AND gates 78, 80, and 82, each possess at least one direct input and will therefore each have at least one input in a logic-low state. Accordingly, only AND gate 76 will output a logic-high and actuate its respective analog switch 90. The other three AND gates 78, 80, and 82, will each output logic-lows and will thus deactivate their respective analog switches, 92, 94, and 96. With analog switch 90 activated and the other three analog switches deactivated, only potentiometer 98 will be interposed between oscillator-signal input conductor 108 and oscillator-signal output conductor 106.

With a nominal battery 24 voltage of 12 volts, the output of comparator 60 will be at a logic-high level while the outputs of comparators 80 and 82 will both be at logic-low levels. Accordingly, only AND gate 78 will have all three of its inputs high and will thus activate its analog switch 92. This, in turn, will interpose potentiometer 100 between oscillator-signal input conductor 98 and oscillator-signal output conductor 106.

With a nominal battery 24 voltage of 18 volts, comparators 60 and 62 will both output logic highs while comparator 64 will still output a logic low. Accordingly, only the output of AND gate 80 will be a logic-high level. Only analog switch 94 will thus be activated which will interpose potentiometer 102 between oscillator-signal input conductor 108 and oscillator-signal output conductor 106.

Finally, with a nominal battery 24 voltage of 24 volts, all three comparators, 60, 62, and 64, will output logic highs. Accordingly, all three inputs of AND gate 82 and will be at logic-high levels. The resulting logic-high level at the output of AND gate 82 will activate analog switch 96. As a result, potentiometer 104 will be interposed between oscillator-signal input conductor 108 and oscillator-signal output conductor 106.

One sees that for each nominal battery voltage, 6, 12, 18, or 24, one particular potentiometer will be selected. The attenuation provided by each potentiometer is initially adjusted so as to bring the output reading of the battery testing device in conformity with the particular nominal voltage of the batter undergoing test. For example, to obtain a quantitative assessment in terms of either load-test current or ampere-hours, or to obtain a qualitative assessment of batteries rated in either cold-cranking amperes or ampere-hours, the potentiometers would be initially adjusted to provide attenuation values inversely proportional to nominal voltage. To obtain a quantitative assessment in terms of available power in watts, or to obtain a qualitative assessment of batteries rated in watts, the potentiometers would be initially adjusted to provide attention values inversely proportional to the square of the nominal voltage.

Although the logic circuit described above is implemented with AND gates, it will be apparent to one skilled in the art that a variety of circuits are possible which would accomplish the same result. One could, for example use NAND, NOR, or OR gates or combinations thereof in comparable logic implementations. Furthermore, if only two nominal battery voltages are to be identified, such as in the circuit disclosed herein below with reference to FIG. 4, logic gates need not be employed at all.

Figure 4:
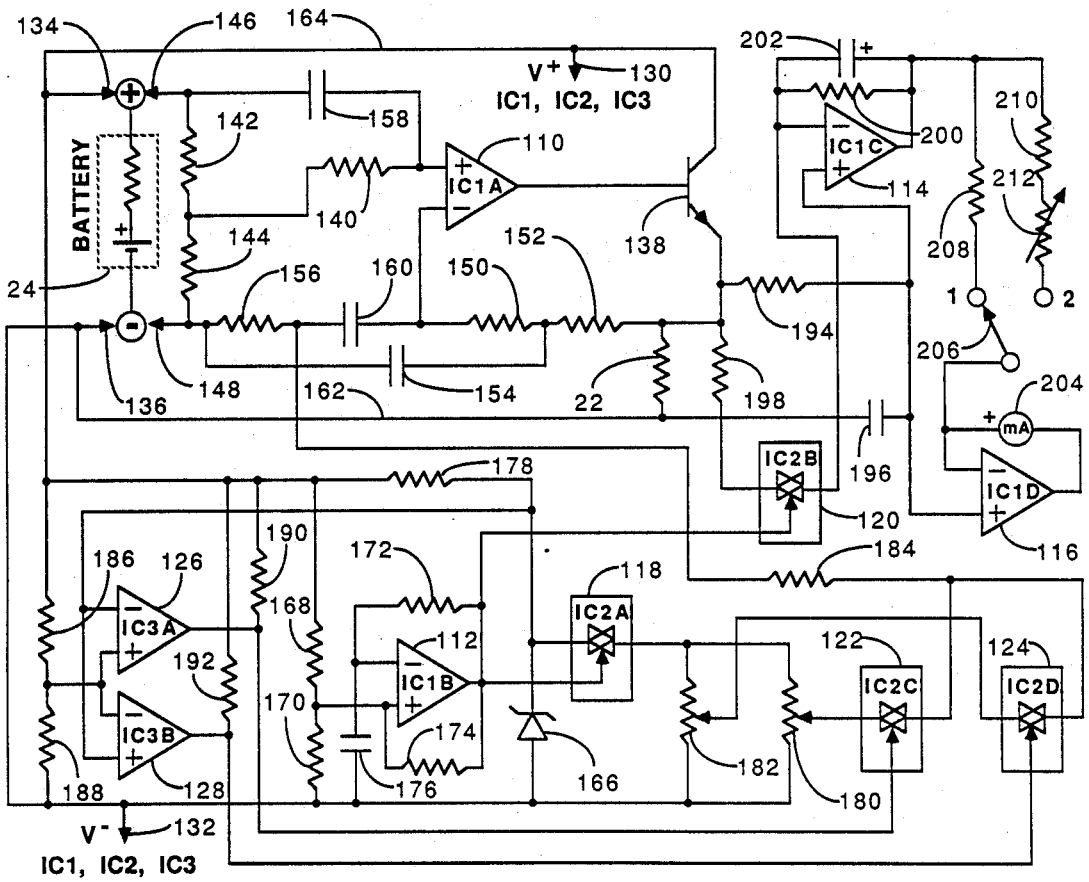
FIG. 4 is a complete schematic diagram of an improved electronic battery testing device having automatic voltage scaling and configured for testing either 6-volt or 12-volt batteries according to the present invention.

FIG. 4 is a complete schematic diagram of an improved electronic battery testing device with automatic voltage scaling configured for testing either 6-volt or 12-volt batteries. Operational amplifiers 110, 112, 114, and 116 comprise four elements of an MSI quad operational amplifier integrated circuit, IC1. Bilateral analog switches 118, 120, 122, and 124 comprise four elements of a quad CMOS bilateral switch integrated circuit, IC2. Voltage comparators 126 and 128 comprise two elements of an MSI quad comparator integrated circuit, IC3. All three integrated circuits IC1, IC2, and IC3 are powered by means of common connections. 130 and 132, to the battery undergoing test 24 through battery contacts 134 and 136, respectively.

High-gain amplifier cascade 12 of FIG. 2 comprises operational amplifier 110 and npn transistor 138 connected to an emitter follower. Resistor 140 conducts a dc bias voltage to the noninverting (+) input of operational amplifier 110 from voltage divider resistors 142 and 144 which are connected to battery 24 through voltage-sensing contacts 146 and 148. The output voltage of high-gain amplifier cascade 12 is established across external-path feedback resistor 22. An internal feedback path comprising resistors 150 and 152 conducts the dc voltage at the common connection between the emitter of npn transistor 138 and resistor 22 to the inverting (−) input of operational amplifier 110. Resistors 150 and 152 along with capacitor 154 comprise low-pass filter 18 of FIG. 2.

The ac signal voltage developed across battery 24 is sensed at voltage-sensing contacts 146 and 148 and added in series to an input signal voltage component established across viewing resistor 156. The resultant composite ac signal voltage is applied to the differential input of operational amplifier 110 by a capacitive coupling network comprising capacitors 158 and 160. A feedback current that is proportional to the voltage established across resistor 22 passes through battery 24 by means of external feedback path conductors 162 and 164 along with current-feedback loop battery contacts 134 and 136.

The ac input signal voltage established across viewing resistor 156 is generated by a precisely-leveled oscillator circuit comprising operational amplifier 112, analog switch 118, and zener diode 166. Operational amplifier 112 along with resistors 168, 170, 172, 174, and capacitor 176 which comprise a conventional astable multivibrator circuit used to generate a square-wave synchronizing signal. Resistor 178 supplies bias current to zener diode 166. The synchronizing output signal of operational amplifier 112 connects to the control input of analog switch 118. The signal terminals of analog switch 118 interconnect the output of zener diode 166 with the inputs of potentiometers 180 and 182. A current proportional to the output voltage of either potentiometer 180 or potentiometer 182 passes through injection resistor 184 and is injected into viewing resistor 156 thereby developing a signal voltage across viewing resistor 156. Potentiometers 180 and 182 provide independent means for setting the level of the square-wave oscillator signal developed across viewing resistor 156 when battery 24 has a nominal terminal voltage of 12 volts, and when it has a nominal terminal voltage of 6 volts, respectively.

The outputs of potentiometers 180 and 182 connect, respectively, to injection resistor 184 through the signal terminals of analog switches 122 and 124. The control inputs of analog switches 122 and 125 connect to the output terminals of voltage comparators 126 and 128, respectively. The inputs of voltage comparators 126 and 128 are connected in parallel opposition so that one of the voltage comparators will output a logic high when the other one outputs a logic low, and vice-versa. A reference voltage is applied to the inverting input of voltage comparator 126 and to the non-inverting input of voltage comparator 128 by connecting these inputs to zener diode 166. In addition, the terminal voltage of battery 24 is sensed through voltage divider resistors 186 and 188, and the divided battery voltage is applied to the non-inverting input of voltage comparator 126 and the inverting input of voltage comparator 128. The values of voltage divider resistors 186 and 188 are chosen such that the divided voltage established at their common connection equals the reference voltage established by zener diode 166 when the terminal voltage of battery 25 is approximately 9 volts.

Because of the circuit arrangement just disclosed, a battery 24 having a nominal terminal voltage of 12 volts will cause the "sensed" voltage presented to comparators 126 and 128 to exceed the "reference" voltage. Accordingly, comparator 126 will be turned "on" and its output will be pulled to a high state by pull-up resistor 190, while comparator 128 will be "off" with its output in a low state. This will, in turn, turn analog switch 122 "on" and analog switch 124 "off", thus interposing only potentiometer 180 between the output of analog switch 118 and injection resistor 184.

On the other hand, a nominal battery 24 voltage of 6 volts will cause the "sensed" voltage to be less than the "reference" voltage. Accordingly, comparator 128 will be turned "on", and its output pulled high by resistor 192, while the output of comparator 126 will be held now. Analog switch 122 will therefore be turned "off", and analog switch 124 turned "on", thus interposing only potentiometer 182 between analog switch 118 and injection resistor 184.

Accordingly, to implement proportional scaling, the two attenuators would be adjusted such that potentiometer 182 provides twice the attenuation of attenuator 180. To implement square-law scaling, the two attenuators would be adjusted such that potentiometer 184 provides four times the attenuation of attenuator 180. Batteries having nominal voltages other than six and twelve can likewise be accommodated. Proportional scaling would result from adjusting the potentiometers to an attenuation ratio equal to the ratio of the two voltages. Square-law scaling would result from adjusting the potentiometers to an attenuation ratio equal to the square of this value.

One sees that the circuit embodiment disclosed in FIG. 4 automatically scales the square-wave oscillator output signal in accordance with the nominal voltage of the battery undergoing test. Further, it provides the desired selection of attenuation without the use of the logic gates disclosed in the circuit of FIG. 3. Other logical circuit means for accomplishing this same result will be apparent to one skilled in the art.

Analog switch 120 along with operational amplifier 114, which is connected as an integrator, comprise detector 40 of FIG. 2. Resistor 194 and bypass capacitor 196 comprise a low-pass filter which biases the noninverting inputs of operational amplifiers 114 and 116 to the voltage level of the dc bias component developed across resistor 22. A signal current derived from the total voltage at the common connection between resistor 22 and transistor 138 passes through resistor 198 and analog switch 120 to the inverting input of operational amplifier 114. This signal current is periodically interrupted at the oscillator frequency by virtue of the control input of analog switch 120 being connected to the output of operational amplifier 112. Resistor 200 provides negative dc feedback to operational amplifier 114. Integration capacitor 202 serves to smooth the detected voltage signal outputted by operational amplifier 114.

A current proportional to the detected signal voltage at the output of operational amplifier 114 passes through milliameter 204 to the output of operational amplifier 116 by way of one of the two paths selected by SPDT switch 206. With switch 206 in position 1, the meter current passes through fixed resistor 208. Under these conditions, the disclosed invention emulates a direct reading battery testing device with quantitative output calibrated in battery measuring units that are proportional to the dynamic conductance of battery 24. With switch 206 in position 2, the meter current passes through fixed resistor 210 and variable resistor 212. Under these conditions the disclosed invention emulates a qualitative, "pass-fail", battery testing device having a manually adjusted battery rating scale that is linearly related to the setting of variable resistance 212, and a rating offset that is determined by the value of fixed resistor 210.

A list of component types and values for the improved electronic battery testing device disclosed in FIG. 4 follows:

| REFERENCE NUMBER | COMPONENT |
| --- | --- |
| Semiconductor Devices | |
| 110, 112, 114, 116 | IC1-LM324N |
| 118, 120, 122, 124 | IC2-CD4066B |
| 126, 128 | IC3-LM339N |
| 138 | TIP31C Power Transistor |
| 166 | 1N5231B Zener Diode |
| Resistors-Ohms (¼-W unless specified) | |
| 22 | 22-5 Watts |
| 156, 210 | 100 |
| 208 | 470 |
| 212 | 500 Variable |
| 142, 144, 178 | 1K |
| 180, 182 | 10K Trimpots |
| 186 | 10K |
| 188 | 15K |
| 140, 200 | 47K |
| 190, 192, 194, 198 | 100K |
| 172 | 150K |
| 174 | 270K |
| 150, 152, 168, 170 | 1 Meg |
| Capacitors-Mfd | |
| 170 | 0.022 |
| 154, 158, 160, 196 | 0.47 |
| 202 | 1.0 |
| Meter | |
| 204 | 1 mA dc milliameter |

Although a specific mode for carrying out the invention hereof has been herein described, it is to be understood that modifications and variations can be made without departing from what is regarded to be the scope and subject matter of the invention.

For example, the battery undergoing test can be measured, or rated, in units different from those described herein. The scaling rule implemented may then be different from either the proportional or square-law scaling rules described herein. The only requirement is that the battery measuring units presented to the user by a direct-reading battery tester embodiment, or the battery rating units manually inputted by the user with a "pass-fail" embodiment, be generally related to dynamic conductance for batteries having a particular nominal terminal voltage.

Further, the number of different nominal voltages identified by the circuitry, as well as their particular values, is completely arbitrary and is not restricted to the numbers and voltage values described herein. In addition, the selectable attenuator can, of course, be inserted at any point in the amplifier chain between the oscillator and the readout device. The invention is therefore not limited to only selectable attenuators that are placed at the oscillator output as disclosed herein. Other, equally effective, means for selectively scaling the output indication provided to the user will be apparent to one skilled in the art.

Still further, the means providing an output display to the user need not be simply a dc milliameter as has been disclosed herein. In the case of a direct-reading battery tester, the requisite numeric display could just as well be provided by a digital meter, a numeric printer, or a computer terminal. In the case of a "pass-fail" battery tester, the requisite qualitative display could just as well be provided by a plurality of light-emitting diodes, colored lights, or an audible display. Other, equally effective, means for implementing an output display will be apparent to one skilled in the art.

These, and other variations of embodiments are believed to be well within the scope of the present invention and are intended to be covered by the appended claims.

What is claimed is:

1. An electronic device for testing a direct current energy source having a dynamic conductance and a nominal voltage comprising:
   a. means operably connected to said source for providing a signal proportional to said dynamic conductance;
   b. means operably connected to said source for identifying said nominal voltage;
   c. attenuator means responsive to said identified nominal voltage for scaling said signal; and,
   d. means for displaying a numerical quantity in response to the level of said scaled signal.

2. A device as in claim 1 wherein said numerical quantity is proportional to the level of said scaled signal.

3. A device as in claim 2 wherein said attenuator means scales said signal in proportion to said identified nominal voltage.

4. A device as in claim 2 wherein said attenuator means scales said signal in proportion to the square of said identified nominal voltage.

5. An electronic device for testing a direct current energy source having a dynamic conductance, a nominal voltage, and an electrical rating comprising:
   a. means operably connected to said source for providing a signal proportional to said dynamic conductance;
   b. means for manually adjusting the level of said signal in accordance with said electrical rating;
   c. means operably connected to said source for identifying said nominal voltage;
   d. attenuator means responsive to said identified nominal voltage for scaling said signal; and,
   e. means for displaying a qualitative assessment of said source in response to the level of said scaled signal.

6. A device as in claim 5 wherein said attenuator means scales said signal in proportion to the identified nominal voltage.

7. A device as in claim 5 wherein said attenuator means scales said signal in proportion to the square of said identified nominal voltage.

8. A system for displaying an assessment of a direct current supply having an internal resistance and a terminal voltage comprising:
   a time-varying voltage source;
   a time-varying current generating means, operably connected to both the voltage source and the supply, producing an output signal proportional to the time-varying voltage source and inversely proportional to the internal resistance;
   selectable attenuator means interposed between the time-varying voltage source and the current generating means output,
   voltage-sensing means operably connected to both the supply and the selectable attenuator means for selecting an attenuation value in response to the terminal voltage of the supply; and,
   means for sensing the current generating means output signal and for providing a display in response thereto.

9. A system according to claim 8 wherein said assessment comprises a quantitative assessment and said display comprises a numeric display.

10. A system according to claim 8 wherein said assessment comprises a qualitative assessment and said display comprises a display of at least two qualitative conditions.

11. A system according to claim 8 wherein said voltage-sensing means identifies a particular nominal voltage among a fixed plurality of possible values by a process which includes comparing a voltage derived from said terminal voltage with at least one reference voltage.

12. A system according to claim 11 wherein said selected attenuation value is inversely proportional to said particular nominal voltage.

13. A system according to claim 11 wherein said selected attenuation value is inversely proportional to the square of said particular nominal voltage.

14. An electronic device for testing a direct current supply possessing an internal resistance and a terminal voltage having one of two possible nominal values comprising:
   a time-varying voltage source producing an input signal;
   a time-varying current generating means, operably connected to both the voltage source and the supply, producing an output signal proportional to the input signal and inversely proportional to the internal resistance;
   means for comparing a voltage derived from the terminal voltage with a reference voltage and attenuating the input signal by either of two attenuation values according to which voltage is greater;
   means responsive to the output signal for producing an output display.

15. An electronic device according to claim 14 wherein the output display comprises a numerical display.

16. An electronic device according to claim 14 wherein the output display comprises a display of qualitative conditions.

17. An electronic device according to claim 16 wherein the supply has an electrical rating and the device includes means for manually adjusting the level of the output signal in accordance with the electrical rating.

18. An electronic device according to claim 14 wherein the ratio of the two attenuation values is the inverse ratio of the two nominal terminal voltage values.

19. An electronic device according to claim 14 wherein the ratio of the two attenuation values is the square of the inverse ratio of the two nominal terminal voltage values.

* * * * *

UNITED STATES PATENT AND TRADEMARK OFFICE
CERTIFICATE OF CORRECTION

PATENT NO. : 4,825,170

DATED : April 25, 1989

INVENTOR(S) : Keith S. Champlin

It is certified that error appears in the above-identified patent and that said Letters Patent is hereby corrected as shown below:

Column 1, line 27, delete the word "stator" and substitute therefor --starter--.

Column 1, line 29, delete the word "induction" and substitute therefor --indication--.

Column 4, line 35, delete the period after the word "voltage" and insert a comma.

Column 5, line 60, the word "square" should be underlined.

Column 5, line 66, the word "square" should be underlined.

Column 8, line 27, delete the number "89" and substitute therefor --80--.

Column 9, line 1, insert the word "at" between the words "be" and "a".

Column 9, line 9, delete the word "and".

Column 9, line 19, delete the word "batter" and substitute therefor --battery--.

UNITED STATES PATENT AND TRADEMARK OFFICE
CERTIFICATE OF CORRECTION

PATENT NO. : 4,825,170

DATED : April 25, 1989

INVENTOR(S) : Keith S. Champlin

It is certified that error appears in the above-identified patent and that said Letters Patent is hereby corrected as shown below:

Column 9, line 29, delete the word "attention" and substitute therefor --attenuation--.

Column 9, line 30, the word "square" should be underlined.

Column 9, line 58, delete the word "to" and substitute therefor --as--.

Column 10, line 8, delete the word "copuling" and substitute therefor --coupling--.

Column 10, line 20, delete the word "which".

Column 10, line 41, delete the number "125" and substitute therefor --124--.

Column 10, line 59, delete the number "25" and substitute therefor --24--.

Column 11, line 8, delete the word "now" and substitute therefor --low--

UNITED STATES PATENT AND TRADEMARK OFFICE
CERTIFICATE OF CORRECTION

PATENT NO. : 4,825,170

DATED : April 25, 1989

INVENTOR(S) : Keith S. Champlin

It is certified that error appears in the above-identified patent and that said Letters Patent is hereby corrected as shown below:

```
Column 11, line 32, delete the word "logical"
and substitute therefor --logic--.

Column 13, line 43, delete the word "the"
and substitute therefor --said--.
```

Signed and Sealed this
Sixteenth Day of January, 1990

*Attest:*

JEFFREY M. SAMUELS

*Attesting Officer*     *Acting Commissioner of Patents and Trademarks*